United States Patent [19]
Korb et al.

[11] Patent Number: 5,779,791
[45] Date of Patent: Jul. 14, 1998

[54] PROCESS FOR CONTROLLING THERMAL HISTORY OF CZOCHRALSKI-GROWN SILICON

[75] Inventors: Harold W. Korb, Town & Country; Sadasivam Chandrasekhar, Chesterfield, both of Mo.; Robert J. Falster, Milan, Italy; Joseph C. Holzer, Manchester, Mo.; Kyong-Min Kim, St. Charles, Mo.; Steven L. Kimbel, St. Charles, Mo.; Larry E. Drafall, St. Charles, Mo.

[73] Assignee: MEMC Electronic Materials, Inc., St. Peters, Mo.

[21] Appl. No.: 694,157

[22] Filed: Aug. 8, 1996

[51] Int. Cl.$^6$ .................................................. C30B 15/20
[52] U.S. Cl. .......................... 117/15; 117/14; 117/200
[58] Field of Search .............................. 117/13, 14, 15, 117/20, 200, 202

[56] References Cited

U.S. PATENT DOCUMENTS

| | | | |
|---|---|---|---|
| 5,131,974 | 7/1992 | Oda et al. | 117/20 |
| 5,215,620 | 6/1993 | Kodama et al. | 117/13 |
| 5,363,796 | 11/1994 | Kobayashi et al. | 117/30 |
| 5,474,020 | 12/1995 | Bell et al. | 117/20 |
| 5,487,355 | 1/1996 | Chiou et al. | 117/14 |
| 5,501,172 | 3/1996 | Murai et al. | 117/14 |

OTHER PUBLICATIONS

M. Hourai, T. Nagashima, E. Kajita, S. Miki, S. Smita, M. Sano and T. Shigematsu, "Oxygen Precipitation Behavior In Silicon During Czochralski Crystal Growth," in *Semiconductor Silicon 1994*, pp. 156–167, Eds., H.R. Huff, W. Bergholz and K. Sumino (Princeton, NJ; The Electrochem. Soc., 1994).

H. Harada, T. Abe and J. Chikawa, "Oxygen Precipitation Enhanced With Vacancies In Silicon," *Semiconductor Silicon 1986*, pp. 76–85, Eds., H.R. Huff, T. Abe and B.O. Kolbesen Pennington, NJ; The Electrochem Soc., 1986).

*Primary Examiner*—FeLisa Garrett
*Attorney, Agent, or Firm*—Senniger, Powers, Leavitt & Roedel

[57] ABSTRACT

A Czochralski method of producing a single crystal silicon ingot having a uniform thermal history from a silicon melt contained in a crucible coaxial with the ingot. In the process the pulling rate of the end-cone of the ingot is maintained at a relatively constant rate which is comparable to the pulling rate for the second half of the main body of the ingot. During the pulling of the end-cone of the crystal at a constant rate, the process may be further refined by, either independently or in combination, increasing the heat supplied to the melt, reducing the crystal rotation rate and/or reducing the crucible rotation rate. The second half of the main body of a single crystal silicon ingot grown in accordance with this process exhibits a relatively uniform axial concentration of flow pattern defects and amount of oxygen precipitated.

51 Claims, 13 Drawing Sheets

CRYSTAL TEMPERATURE PROFILE AFTER DETACHMENT FROM THE MELT (IMPROVED PROCESS)

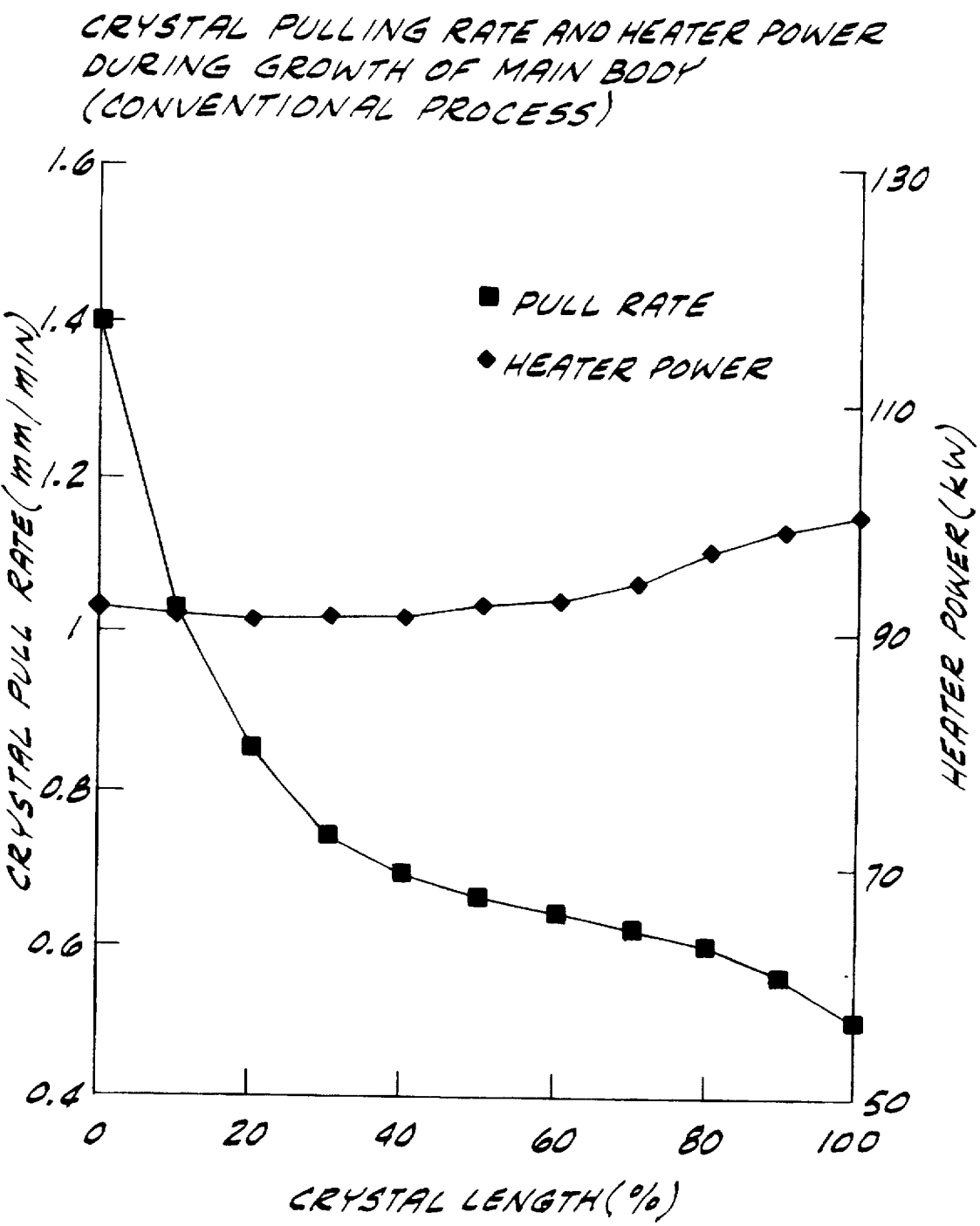

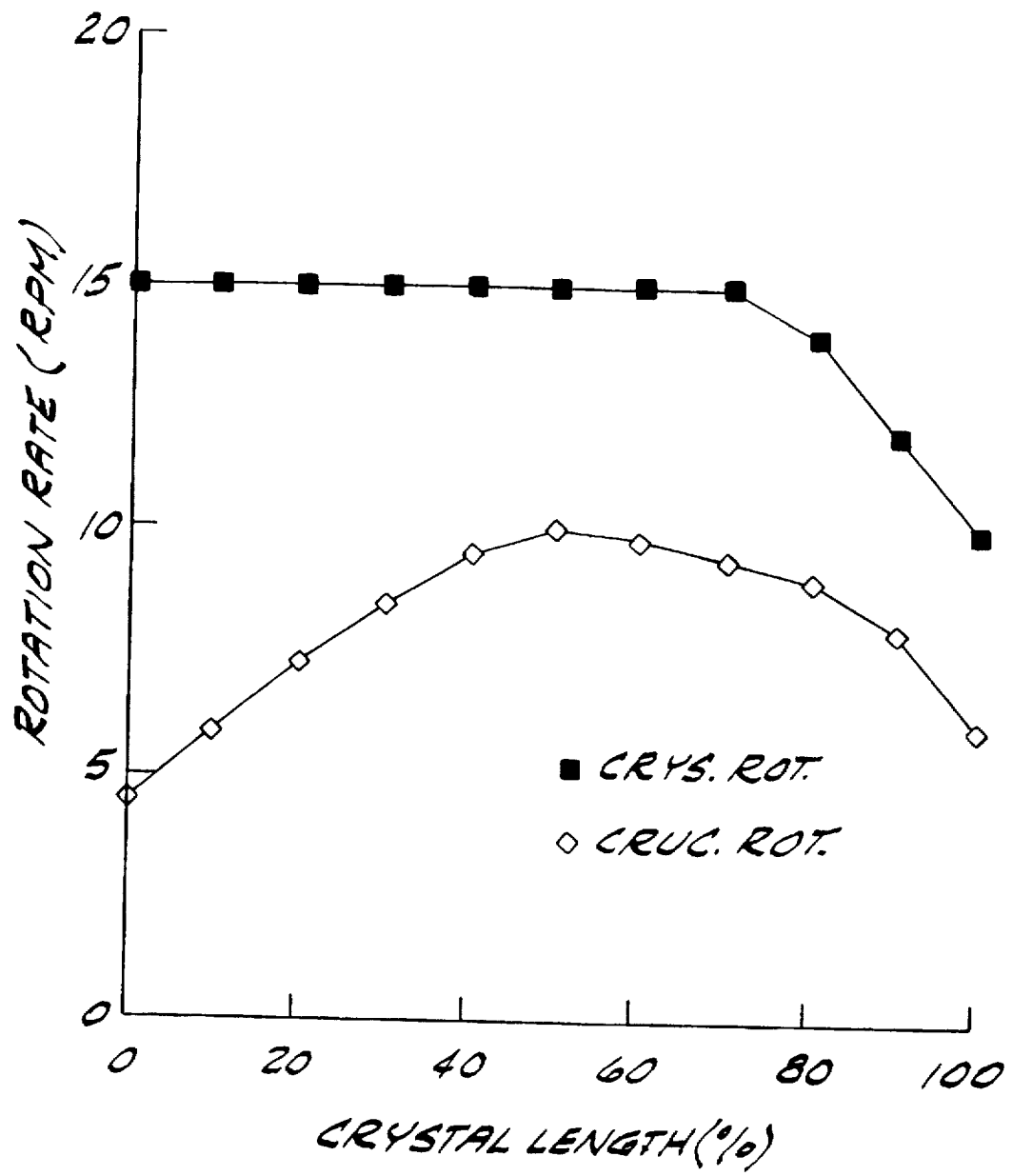

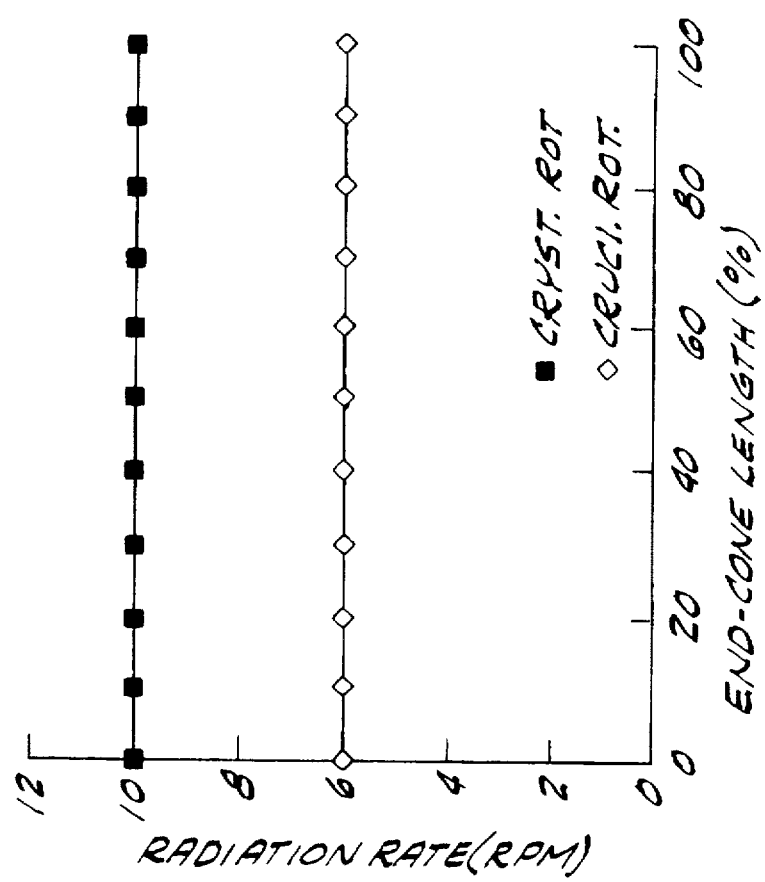
FIG. 2d CRYSTAL AND CRUCIBLE ROTATION RATES DURING CONVENTIONAL GROWTH OF END-CONE
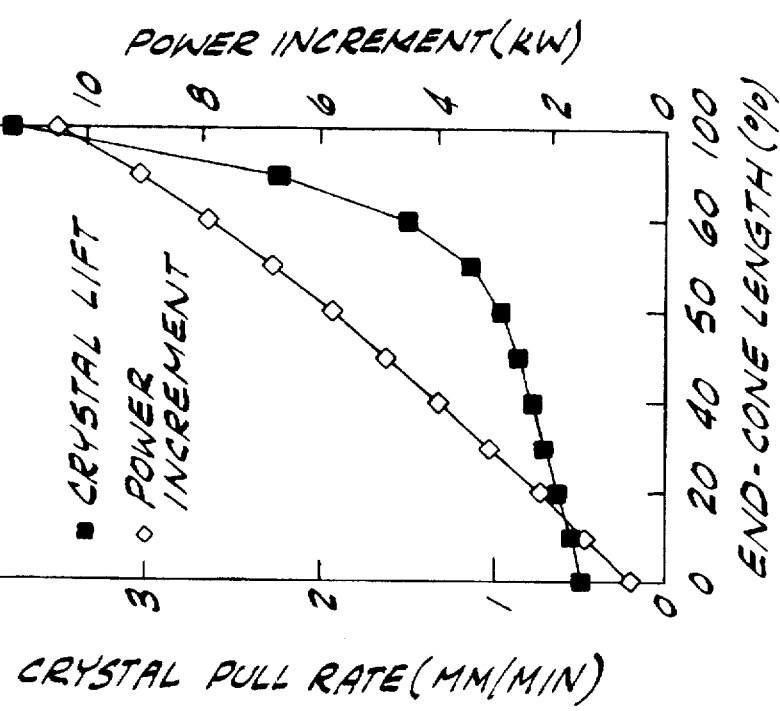
FIG. 2c CRYSTAL PULL RATE AND POWER INCREMENT DURING CONVENTIONAL GROWTH OF END-CONE

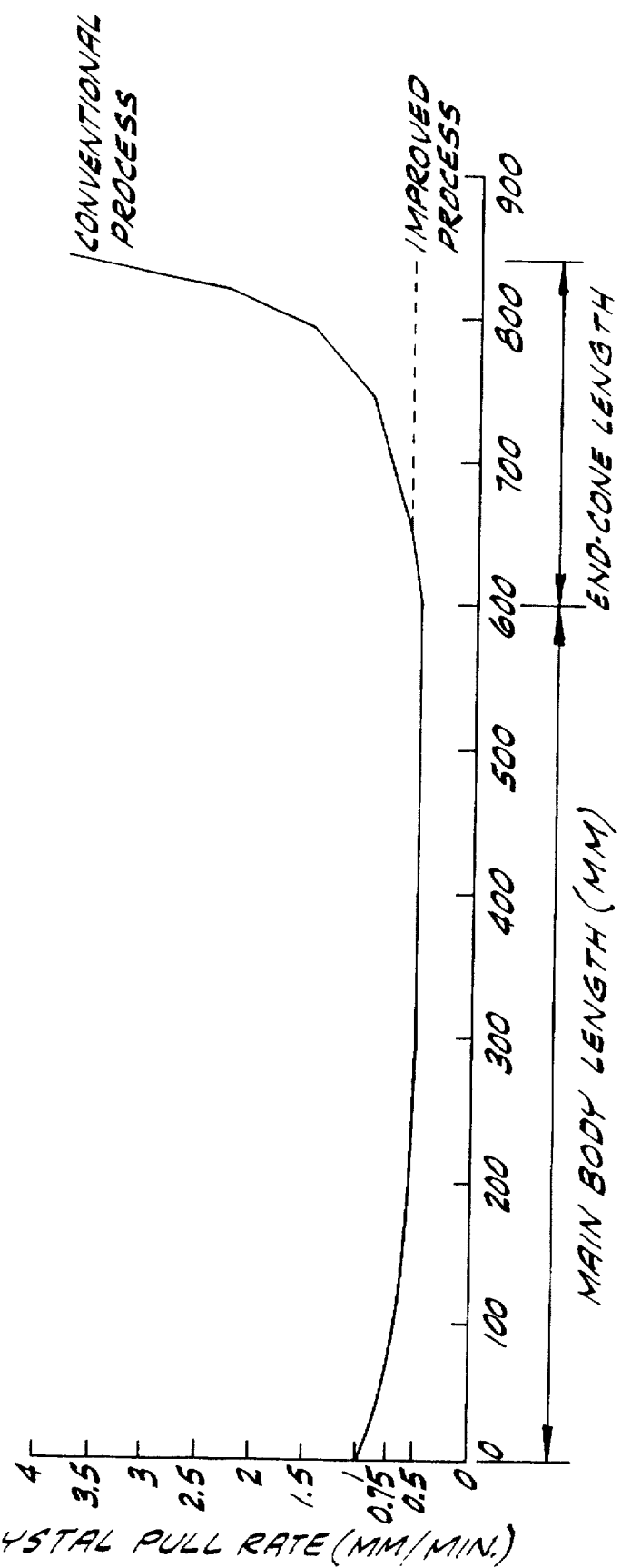
FIG. 3 COMPARISON OF CRYSTAL PULL RATES FOR CONVENTIONAL PROCESS AND IMPROVED PROCESS

CRYSTAL TEMPERATURE PROFILE AFTER
DETACHMENT FROM THE MELT
(IMPROVED PROCESS)

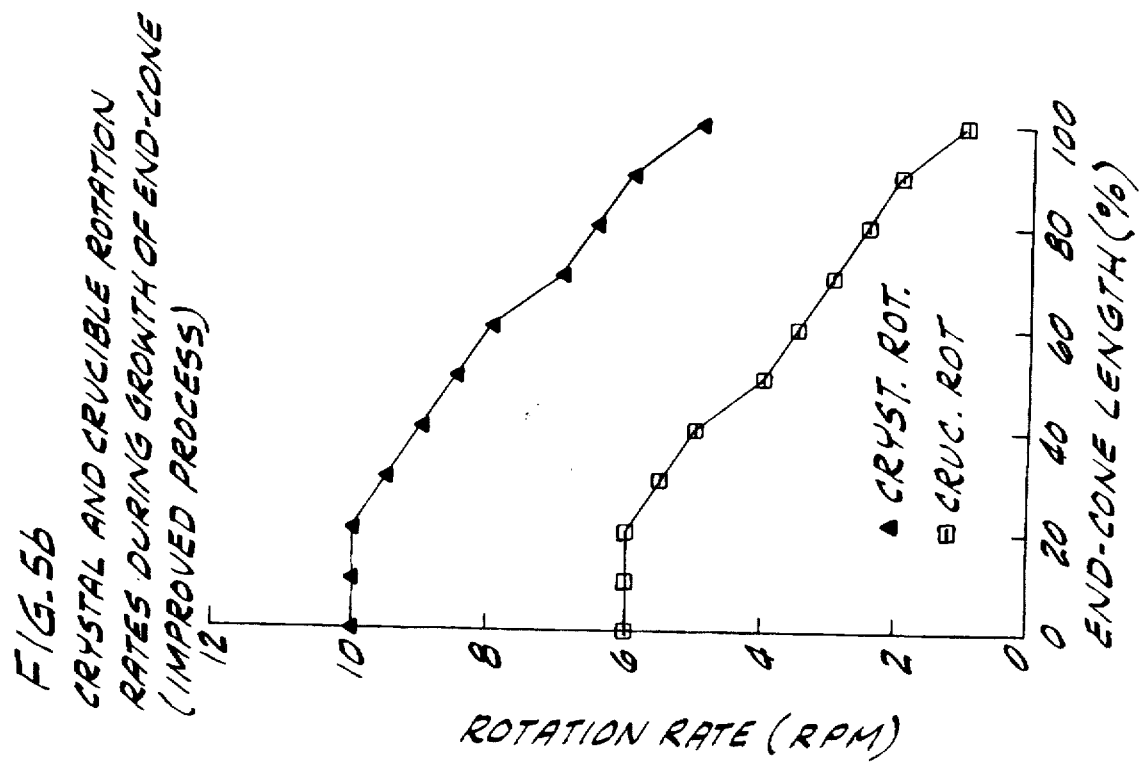
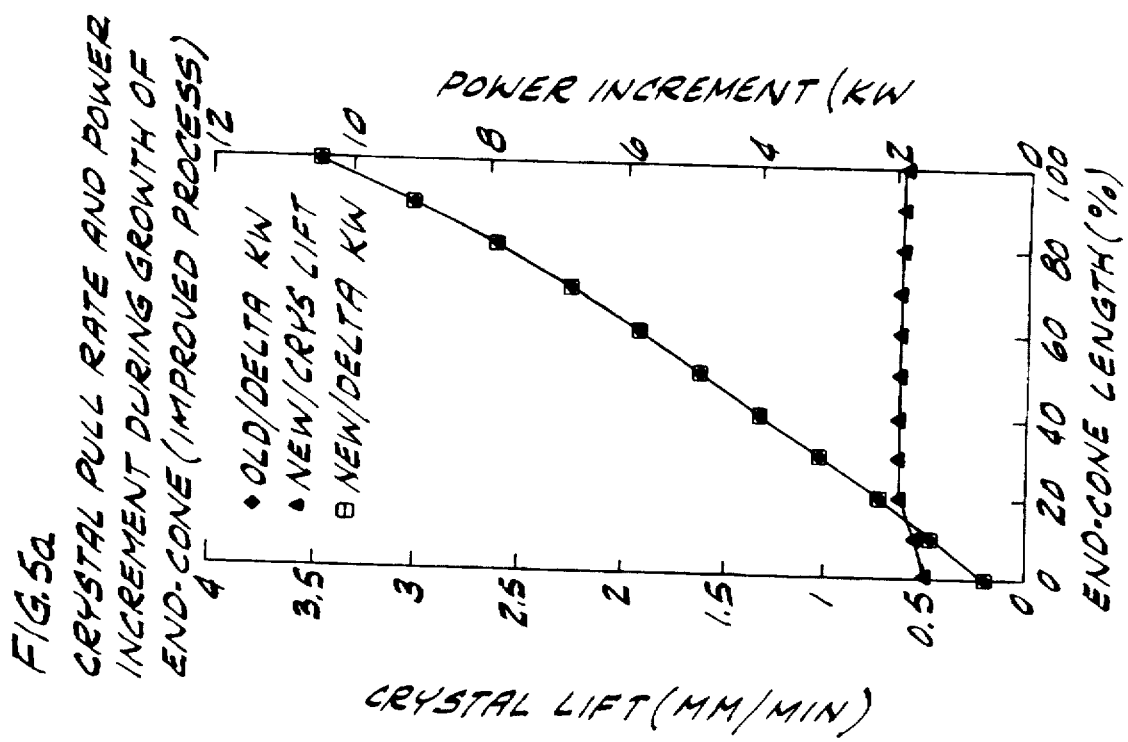

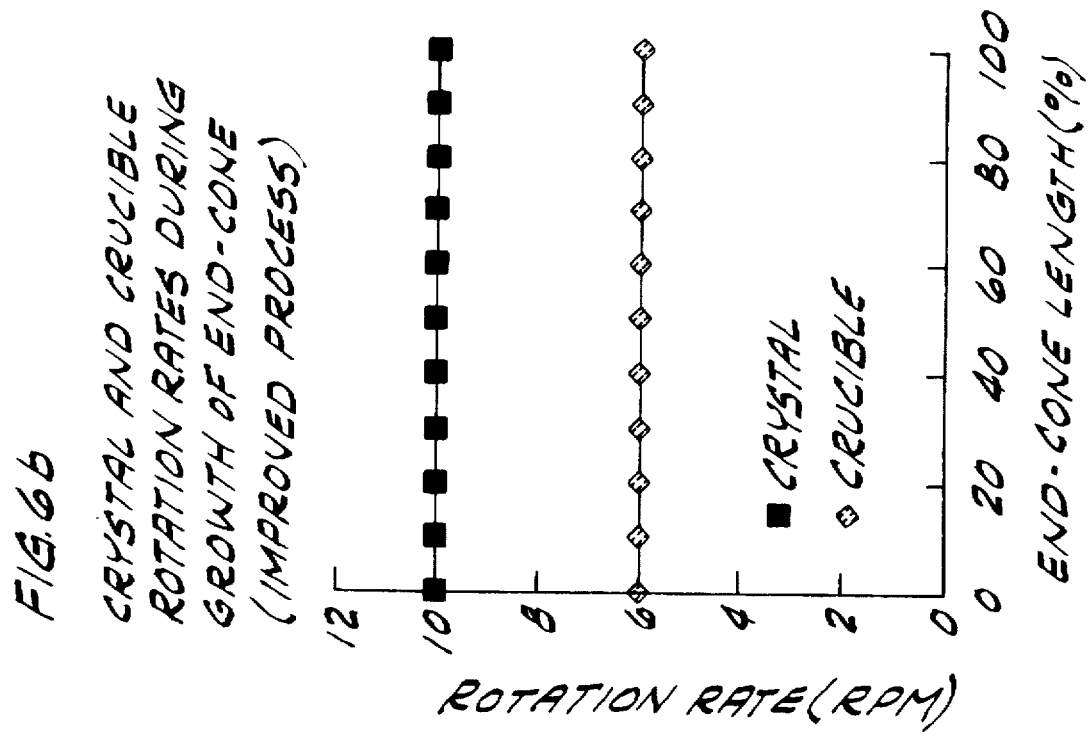
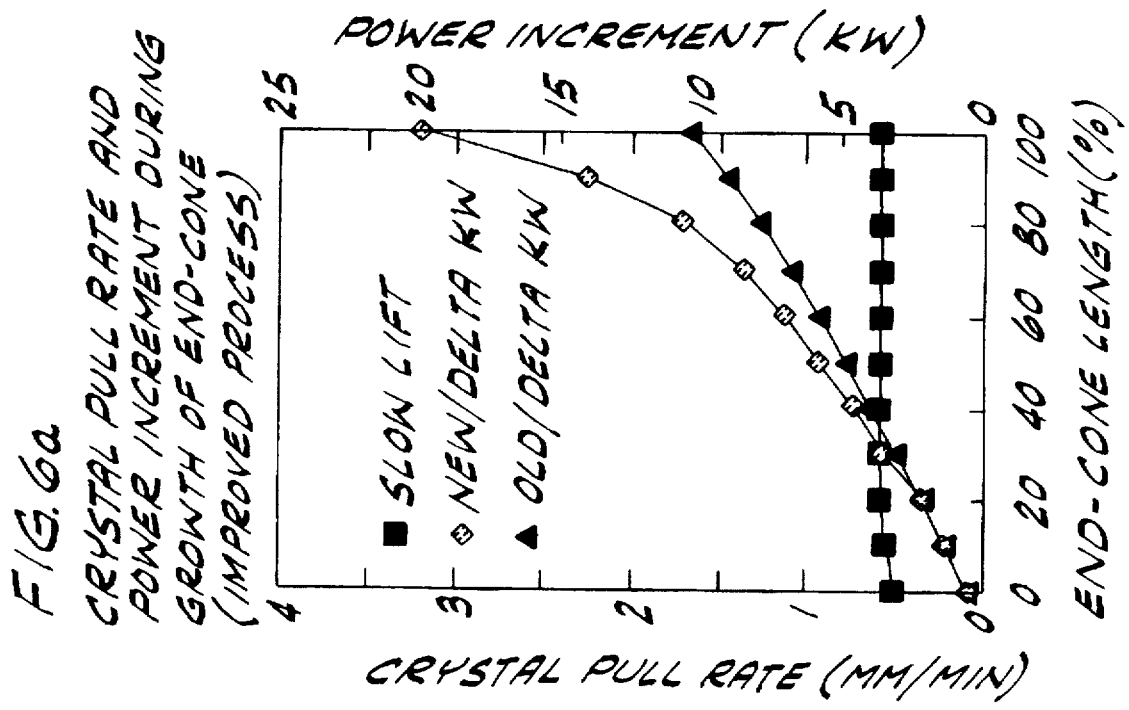

OXYGEN PRECIPITATION
(CONVENTIONAL PROCESS)

OXYGEN PRECIPITATION
(IMPROVED PROCESS)

PROCESS FOR CONTROLLING THERMAL HISTORY OF CZOCHRALSKI-GROWN SILICON

BACKGROUND OF THE INVENTION

In general, the present invention relates to the preparation of single crystal silicon according to the Czochralski method. In particular, the invention relates to a process for controlling the thermal history of the crystal as it is grown.

Single crystal silicon which is the starting material for most processes for the fabrication of semiconductor electronic components is commonly prepared by the so-called Czochralski method. In this method, polycrystalline silicon ("polysilicon") is charged to a crucible and melted, a seed crystal is brought into contact with the molten silicon and a single crystal is grown by slow extraction. As crystal growth is initiated, dislocations are generated in the crystal from the thermal shock of contacting the seed with the melt. The dislocations are propagated throughout the growing crystal and multiplied unless they are eliminated in the neck region between the seed crystal and the main body of the crystal.

After dislocations are eliminated in the neck, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Typically, the pull rate is between about 0.40 mm/minute to about 1.50 mm/minute during the growth of the main body of the crystal.

Near the end of the growth process but before the crucible is emptied of molten silicon, the crystal diameter must be reduced gradually to form an end-cone in order to minimize thermal shock, which can cause slip dislocations at the tail end of the crystal. Typically, the end-cone is formed by increasing the crystal pull rate and heat supplied to the crucible. When the diameter becomes small enough, the crystal can be separated from the melt without the generation of dislocations. At the time the crystal detaches from the silicon melt, the crystal pull rate conventionally is about seven times greater than the average crystal pull rate employed during the growth of the main body.

In recent years, it has been recognized that a number of defects in single crystal silicon form in the crystal growth chamber during the cooling of the crystal after solidification and that the formation of such defects is dependent upon the cooling rate of the crystal. Different cooling rates result in different defect concentrations. These defects and the uniformity of these defects throughout the crystal are becoming of rapidly increasing importance to electronic device fabricators since the defects can severely impact the yield potential of the material in the production of complex and highly integrated circuits.

One solution which has been proposed is to annihilate the defects subsequent to their formation. Such defect reduction approaches generally rely upon high temperature heat treatments of the silicon in wafer form. The specific treatment needed will vary depending upon the concentration and location of defects in the crystal. Different wafers cut from a crystal which does not have a uniform axial concentration of defects each may require different post-growth processing. This solution, however, is relatively costly and potentially introduces metallic impurities into the crystal. In addition, this approach is not universally effective for all crystal-related defects, especially for defects in the tail end of the crystal.

Another solution which has been proposed is to reduce the density of the defects during crystal growth by influencing the defect nucleation rates. For example, in U.S. Pat. No. 5,248,378 Oda et al. suggest the use of a heat insulator (or alternatively, a heater) within the growth chamber in order to grow a crystal having a greater residence time in the temperature range above 1150° C. to reduce defects and improve the oxide film dielectric breakdown strength. This method, however, requires modification of the growth chamber and these modifications can also be a source of contamination within the crystal puller.

Others have suggested reducing the pull rate during the growth of the constant diameter portion of the crystal to a value less than about 0.4 mm/min. This suggestion, however, is not entirely satisfactory because the pull rate is relatively slow, leading to reduced throughput for each crystal puller.

SUMMARY OF THE INVENTION

Among the several objects and features of the present invention is the provision of a process for controlling the thermal history of single crystal silicon; the provision of a process for controlling the uniformity of defects in single crystal silicon, preferably single crystal silicon in which the dominant intrinsic point defects are vacancies; the provision of such a process which does not require high-temperature heat treatments, or does not require differing high-temperature heat treatments, of the silicon in wafer form; the provision of such a process which does not require significant modification of the crystal puller apparatus; the provision of such a process which does not materially reduce throughput by reducing the pull rate during the growth of the main body of the crystal; the provision of such process in which the cooling rate of the crystal is controlled in the crystal puller to improve the uniformity of the thermal history of the main body of the crystal; and the provision of such a process in which the residence time of the crystal in the crystal puller at temperatures above about 950° C. is controlled to improve uniformity of the thermal history of the main body of the crystal.

Briefly, therefore, the present invention is directed to a process for producing single crystal silicon having a uniform thermal history in accordance with the Czochralski method. In this process, the silicon crystal is pulled from the silicon melt at a relatively constant rate during the growth of not only the main body, but also during the growth of the end-cone of the crystal. The relatively constant rate may be achieved, for example, by (i) reducing the rates of rotation of the crucible and crystal during the growth of the end-cone relative to the crucible and crystal rotation rates during the growth of the main body of the crystal, and/or (ii) increasing the power supplied to the heater used to heat the silicon melt during the growth of the end-cone relative to the power conventionally supplied during end-cone growth. These additional adjustments of the process variables may occur either individually or in combination.

The present invention is further directed to a process for controlling the formation and uniformity of defects in Czochralski-grown crystal, particularly flow pattern defects and oxygen precipitates. In the process, the crystal pull rate is controlled so as to maintain a relatively uniform residence time and rate of cooling in the temperature range from about 950°C. to about 1100° C. for substantially the entire main body of the crystal. These factors may be controlled, for example, by maintaining the average crystal pull rate during the growth of the end-cone at a value near the average crystal pull rate employed during the growth of the main body.

Other objects and features of the present invention will be in part apparent and in part pointed out hereinafter.

BRIEF DESCRIPTION OF THE DRAWINGS

FIG. 2(a) is a graph showing a typical linear model of the crystal pull rate and heater power during the growth of the main body of a 200 mm nominal diameter crystal in the conventional manner.

FIG. 2(b) is a graph showing a typical linear model of the crucible and crystal rotation rates during the growth of the main body of a 200 mm nominal diameter crystal in the conventional manner.

FIG. 2(c) is a graph showing a typical linear model of the crystal pull rate and incremental power increase during the growth of a end-cone on a 200 mm nominal diameter crystal in the conventional manner.

FIG. 2(d) is a graph showing a typical linear model of the crucible and crystal rotation rates during the growth of an end-cone on a 200 mm nominal diameter crystal in the conventional manner.

FIG. 3 is a graph showing linear models of the crystal pull rates for 200 mm nominal diameter crystals pulled in the conventional manner and in accordance with the improved process.

FIGS. 5(a) and 6(a) are graphs showing linear models of the crystal pull rate and incremental power increase for end-cones grown in accordance with two different embodiments of the present invention.

FIGS. 5(b) and 6(b) are graphs showing linear models of the crucible and crystal rotation rates for the same end-cones reflected in FIGS. 5(a) and 6(a).

DETAILED DESCRIPTION OF THE PREFERRED EMBODIMENTS

The process of the present invention advantageously produces Czochralski single crystal silicon having a uniform thermal history substantially throughout the main body of the crystal. In this process, the cooling rate and residence time of the as-grown crystal at temperatures above about 950° C. are controlled by maintaining a relatively constant crystal pull rate throughout the crystal growth and adjusting, if necessary, the crystal and crucible rotation rates and/or the power supplied to the heater for the process. Crystals grown by this process exhibit a relatively uniform axial concentration of defects such as flow pattern defects and oxygen precipitates, particularly in the second half or tail end, of the crystal. Such uniformity can, among other advantages, reduce the post-growth processing problems and expense encountered with nonuniform crystals.

Figure 1:
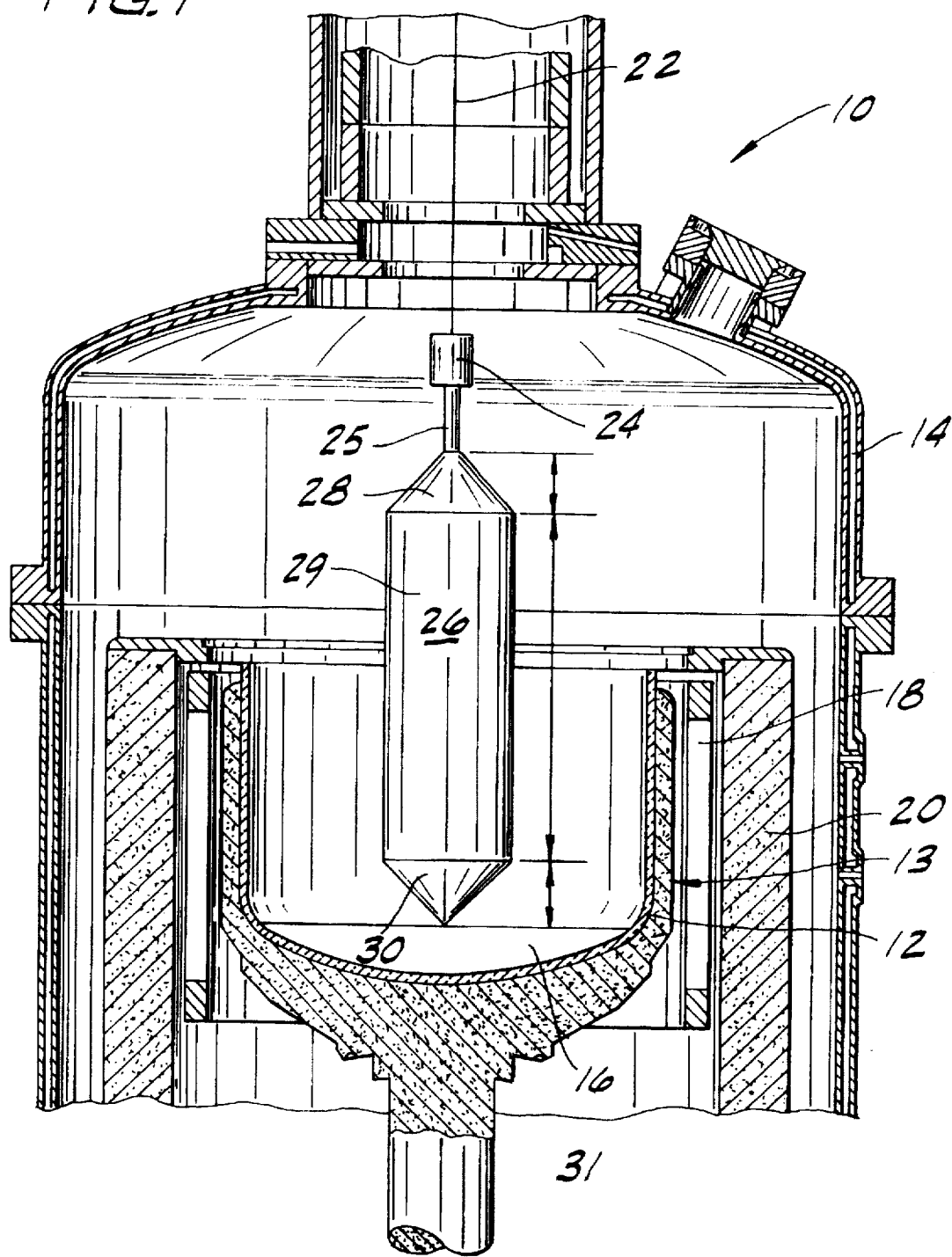
FIG. 1 is a sectional view of a Czochralski growth apparatus in accordance with an embodiment of the present invention.

Referring now to FIG. 1, there is shown a crystal pulling apparatus 10 for producing silicon single crystal ingots by the Czochralski method. The crystal pulling apparatus 10 includes a fused silica crucible 12 surrounded by a graphite susceptor 13 and contained within a water-cooled stainless steel growth chamber 14. The crucible 12 holds a polycrystalline silicon melt 16. The silicon melt is provided by adding solid polycrystalline silicon (not shown) to the crucible 12. The solid silicon is melted by heat provided from a heater 18 which surrounds the crucible 12. The heater 18 is surrounded by insulation 20 to retain the heat within the crucible.

A crystal pulling shaft or wire 22 supporting a monocrystalline silicon seed 24 at its lower end is positioned above the silicon melt 16. As the seed crystal is lowered into the molten silicon 16, the seed begins to melt. After thermal equilibration, the pulling wire 22 is then retracted withdrawing the seed 24 from the molten silicon 16. As the seed 24 is withdrawn, the liquid silicon from the melt solidifies around the seed in a single crystal above the melt 16. The pulling wire 22 from which the formed single crystal is suspended is continuously retracted from the melt as it rotates, forming a substantially cylindrical crystal 26 as in a conventional Czochralski process. After a neck region 25 of the crystal is formed, the pull rate is decreased creating an outwardly flaring region 28 typically referred to as the cone of the crystal. When the desired diameter is obtained, the pull rate and other growth conditions are controlled to provide a substantially continuous diameter for the main body 29 between the seed-cone 28 and the end-cone 30 of the crystal 26.

While the single crystal 26 is being pulled, the crucible 12 is rotated via a shaft 31 in a direction opposite that of the crystal 26. As the crystal grows, the crucible 12 is raised within the growth chamber 14 to compensate for depletion of the silicon melt 16. When the melt is nearly depleted, the process variables are adjusted to decrease the crystal diameter resulting in the formation of a conical end-cone 30 of the crystal 26. Once the diameter of the end-cone 30 is sufficiently small, generally 2 mm to 4 mm, detachment of the crystal 26 from the silicon melt can be accomplished without causing dislocations to spread to the main body of the crystal. The single crystal ingot 26 is then removed from the growth chamber 14 and processed to form silicon wafers.

Each solidified segment of the growing crystal cools as it is lifted up and away from the silicon melt and crucible during the growth process resulting in an axial temperature gradient within the crystal. A solidified segment of the crystal at the melt interface has a temperature of about 1412° C. Earlier grown segments of the crystal have a correspondingly lower temperature. For a 200 mm nominal diameter crystal, for example, the temperature gradient immediately after the crystal is detached from the silicon melt ranges from about 1412° C. at the tip of the end-cone to less than about 750° C. at the seed-cone. Once detached from the melt, however, the crystal no longer has the benefit of the conductive heat received directly from the silicon melt and crucible and cools even more quickly than during the growth process.

The crystal's axial temperature gradient depends upon the rate at which each solidified segment of the crystal cools after being pulled from the melt. For a constant diameter crystal this cooling rate depends primarily upon the crystal pull rate and power supplied to the heater. The cooling rate also depends to a lesser extent upon the crystal and crucible rotation rates due to the relationship between these rotation rates and range of available crystal pull rates. Assuming a constant crystal pull rate and a constant power supply throughout the growth process, a growing crystal cools at a relatively constant rate.

Conventionally, however, the pull rate is not maintained at a relatively constant rate. The crystal pull rate at the start of the growth of the crystal ranges from about 1.00 mm/minute to about 1.50 mm/minute. As the growth of the crystal progresses, the crystal pull rate is reduced to between about 0.45 mm/minute to about 1.25 mm/minute. During the growth of the second half of the main body of the crystal, the pull rate generally is in the range of about 0.45 mm/minute to about 1.00 mm/minute for most Czochralski-grown crystals. For example, the pull rate during the growth of the second half of the main body of a 200 mm diameter crystal typically ranges from about 0.45 mm/minute to about 0.55 mm/minute, with an average rate of growth of about 0.50 mm/minute to about 0.55 mm/minute. The pull rate, however, is not independent of other variables. As a general rule, for example, the pull rate decreases as crystal diameter, charge size and puller size increase.

Figure 4:
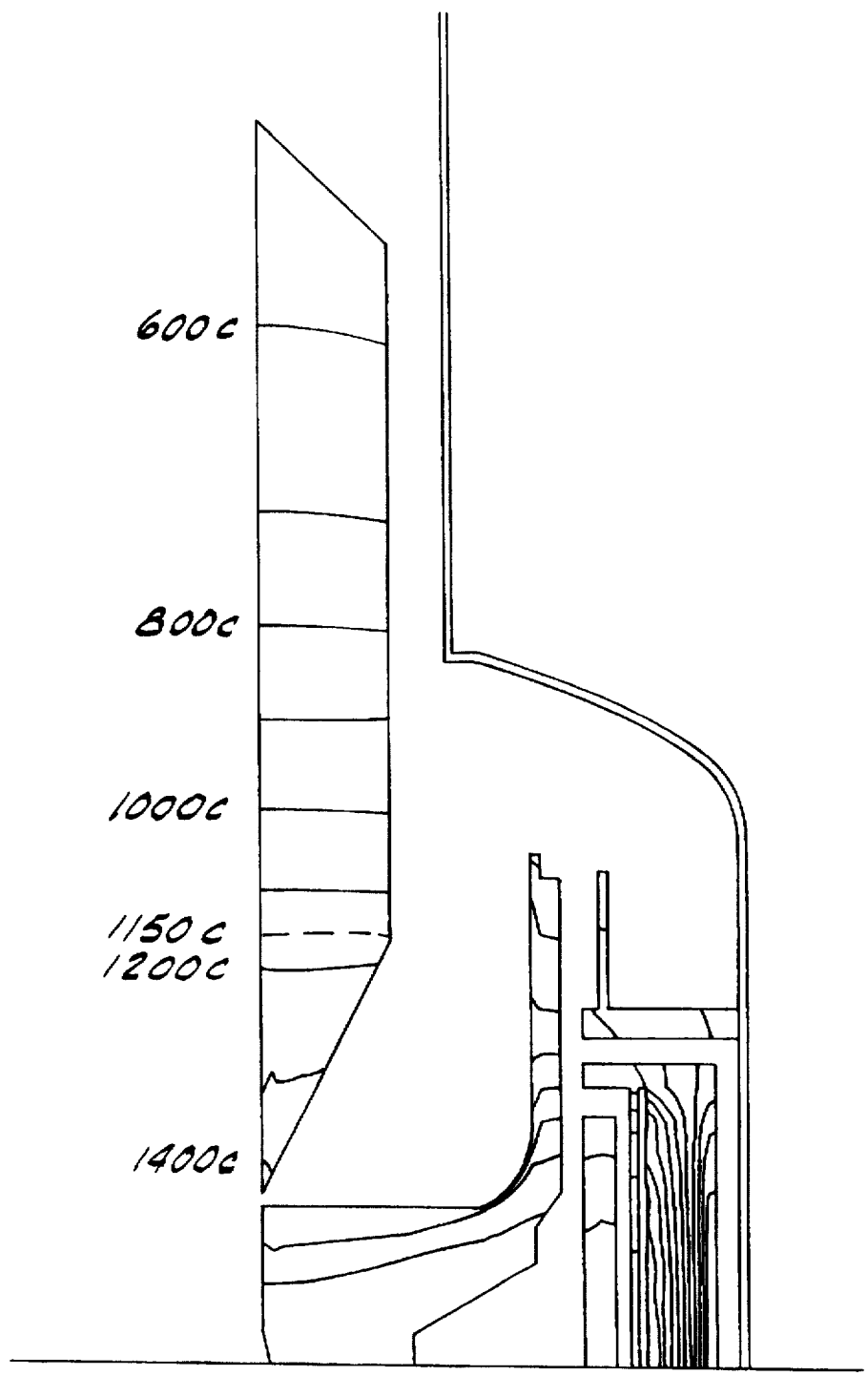
FIG. 4 is a cross-sectional view of a crystal pulled in accordance with the new process reflecting the temperature profile of the crystal immediately after detachment from the silicon melt.

For conventional Czochralski-grown silicon the crystal pull rate employed during the growth of the end-cone differs significantly from the main body growth rate. The crystal pull rate during end-cone growth is rapidly increased relative to the crystal pull rate employed during the growth of the second half of the main body. When the end-cone finally detaches from the silicon melt, the crystal pull rate generally is about 4.00 mm/minute or greater. The average crystal pull rate during the conventional growth of the end-cone is typically about 1.50 mm/minute. This results in a significantly higher cooling rate and lower residence time at temperatures between about 950° C. and about 1100° C. for the lower portion of the crystal. FIGS. 2(a)–(d) and 3 show typical values of crystal pull rate, crystal and crucible rotation rates, and power for crystals grown in the conventional manner and in accordance with the present invention. FIG. 4 is a cross-sectional view of a representative crystal pulled in accordance with the present invention reflecting the temperature profile of the crystal.

This variation in cooling rate and residence time for different segments of the crystal results in corresponding axial variations of the flow pattern defects and oxygen precipitate concentrations in the main body of the crystal, particularly in the second half of the main body. The formation of flow pattern defects and oxygen precipitates in the crystal occurs in the temperature range of about 1100° C. to about 950° C. and is dependent upon the rate of cooling for the crystal. Flow pattern defects are mainly a problem in silicon crystal having intrinsic point defects which are predominately vacancies rather than interstitials. Device performance and yield depends upon the uniformity and concentration of these defects.

The vacancy concentration of the crystal reaches critical supersaturation and flow pattern defects begin to form over a narrow temperature range once the temperature of the crystal cools to about 1100° C. These flow pattern defects are agglomerates of individual vacancies and act as "sinks" which attract and collect other vacancies as the crystal cools to about 950° C. Although the number of flow pattern defects remains substantially constant as the crystal continues to cool from about 1100° C., the size of the individual flow pattern defects continues to increase. In this temperature range the most favorable energy state favors the formation of such flow pattern defects. Once the temperature of the crystal drops below about 950° C., no further change occurs in the density of vacancies and the size of the flow pattern defects. As long as the temperature of a segment of the crystal is maintained between about 950° C. and about 1100° C., however, the density of vacancies in that segment continues to decline as such vacancies agglomerate into flow pattern defects. Therefore, the more quickly a crystal cools after being pulled from the melt, the higher the density of vacancies. If the cooling rate for each segment of the crystal is not uniform, neither will be the density of these defects throughout the crystal.

The density of vacancies in turn influences oxygen precipitation behavior. Generally, as the density of vacancies decreases, so does the rate of formation of oxygen clusters in the crystal. If the crystal cooling rate is sufficiently slow, then the vacancies can be largely eliminated from the crystal through conversion into flow pattern defects which do not materially influence oxygen precipitation behavior. At a minimum, such vacancies can be reduced to a level at which they no longer materially influence the formation of oxygen clusters.

The axial concentrations of flow pattern defects and oxygen precipitates in a conventionally-grown crystal typically show significant variation. While the concentrations for the middle portion of the crystal are reasonably uniform, the concentrations for the seed end and the tail end are not. The increased pull rate during the growth of the end-cone results in faster cooling for the tail end and causes the concentration of oxygen precipitates in the tail end to increase.

Seed end nonuniformity typically can be eliminated by post-growth high-temperature heat treatment of the crystal. This treatment usually consists of wafer annealing at temperatures ranging from about 900° C. to about 1000° C. Prior attempts to remedy tail end nonuniformity by high-temperature heat treatment have not been satisfactory. Oxygen precipitates in the tail end do not redissolve as readily as oxygen precipitates in the seed end. Therefore, wafer annealing is carried out at temperatures above about 1000° C. to 1200° C. This annealing is not completely effective to eliminate nonuniformities in the crystal. It also introduces other problems into the crystal such as metallic contamination and slip dislocations.

In contrast, in the improved process significant nonuniformities in the tail end relative to the main body of the crystal are eliminated or minimized by maintaining a relatively constant cooling rate and residence time as the crystal cools at temperatures ranging between about 950° C. and about 1100° C. By keeping the average crystal pull rate during the growth of the end-cone at a rate comparable to the crystal pull rate employed during the growth of the second half of the main body, the cooling rate for the second half of the main body is relatively uniform using the improved process. Because of the relatively constant crystal pull rate, each segment of the main body of the crystal has a comparable cooling rate and residence time at temperatures between about 950° C. and about 1100° C. The pull rate can be controlled as precisely as needed. The greater the uniformity desired in the thermal history of the crystal, the more precisely the pull rate is controlled.

It has been discovered that post-growth processing problems are minimized and crystal uniformity of the second half of the main body generally is brought within acceptable limits if the variation in average cooling rate and residence time at temperatures between about 950° C. and 1100° C. for each segment of the second half of the main body relative to the other segments of the second half does not exceed about 50%. Preferably, the variation does not exceed about 35%. More preferably, the variation does not exceed about 20%. Still more preferably, the variation does not exceed about 5%. Most preferably, the variation does not exceed about 5%. Absolute values of the relative cooling rates and residence time will vary depending upon the crystal puller used, crystal diameter and other variables. Absolute values, however, are not critical to the invention; rather, the relative difference between the absolute values is the important consideration. Further, the acceptable variation in uniformity of the crystal will depend upon the specific application of the crystal. Certain applications demand relatively strict uniformity while other applications allow for less uniformity.

In the present process, the desired cooling rate and residence time for each segment of the crystal are obtained by controlling the growth rate of the crystal. In one embodiment of the invention, the second half of the main body of a silicon crystal is pulled from the silicon melt at a rate $R_B$, wherein $R_B$ is the average growth rate for the second half of the main body of the crystal as a function of time. For example, the $R_B$ of a 200 mm nominal diameter main body pulled from an 18 inch diameter crucible containing a 60 Kg charge generally ranges from about 0.45 mm/minute to about 0.55 mm/minute (as illustrated in FIG. 3). Once the growth of the main body is complete, the end-cone of the crystal is pulled from the silicon melt at a rate $R_E$, wherein $R_E$ is the average growth rate for the end-cone of the crystal as a function of time. The ratio of $R_E$ to $R_B$ generally ranges from about 0.50 to about 1.50. Preferably, the ratio ranges from about 0.65 to about 1.35. More preferably, the ratio ranges from about 0.80 to about 1.20. Still more preferably, the ratio ranges from about 0.90 to about 1.10. Most preferably, the ratio ranges form about 0.95 to about 1.05.

Exemplary values of the crystal pull rate during the end-cone growth under the process conditions specified in Examples 1 and 2 generally range between about 0.45 mm/minute to about 1.25 mm/minute. An average rate of growth for the end-cone between about 0.45 mm/minute to about 0.75 mm/minute is typical. Preferably, the crystal pull rate ranges between about 0.45 mm/minute to about 0.65 mm/minute. More preferably, the crystal pull rate ranges between about 0.45 mm/minute to about 0.65 mm/minute. For larger crystal diameters, these exemplary pull rate values will be correspondingly lower.

The three other primary process variables also may be adjusted, either individually or in combination, to further refine the process. The average power supplied to the heater during the growth of the end-cone may be increased relative to the average power supplied during the growth of the second half of the main body. During the growth of the end-cone in the conventional process, a limited increase in the power supplied occurs during the growth of the end-cone. For example, the power supplied to the heater during the growth of the main body of the 200 mm nominal diameter crystal previously discussed is maintained at between about 90 kW to about 100 kW. The power is then increased in an approximately linear manner during the conventional growth of the end-cone with an overall increase of about 10.5 kW. In this first embodiment of the invention, the average power supplied during end-cone growth is maintained at conventional values.

In addition, the crystal and crucible rotation rates may be adjusted during the growth of the end-cone. The crystal rotation rate and the crucible rotation rate during the growth of the main body generally are maintained at between about 10 rpm to about 15 rpm, and between about 5 rpm to about 10 rpm, respectively. In this first embodiment of the invention the rates of crystal and crucible rotation are adjusted so that their respective average rates during the growth of the end-cone are less than the average crystal and crucible rotation rates during the growth of the main body. Preferably, the crystal rotation rate during the growth of the end-cone is less than about 10 rpm and/or the crucible rotation rate during the growth of the end-cone is less than about 6 rpm. More preferably, the rates of rotation for the crystal and crucible are ramped downward. Most preferably, the rates of rotation for the crystal and crucible are ramped downward from about 10 rpm to about 5 rpm, and from about 6 rpm to about 1 rpm, respectively.

In a second embodiment of the invention, the crystal pull rate and the ratio of $R_E$ to $R_B$ are controlled as provided in the first embodiment of the invention. The other variables, however, are controlled differently. The average crystal and crucible rotation rates are not changed during the growth of the end-cone relative to the average rates maintained during the growth of the second half of the main body. Instead, the only additional primary variable adjusted is the average power supplied to the heater during the growth of the end-cone. The average power is increased relative to the average power conventionally supplied to the heater during the growth of the second half of the main body. For example, the power supplied to the heater during the growth of the end-cone on the 200 mm nominal diameter crystal discussed above is increased in an approximately linear manner during the growth of the end-cone with an overall increase of about 20 kW. Preferably, the average power during end-cone growth is increased to at least 110% of the average power supplied to the heater during the growth of the second half of the main body. More preferably, the average power during end-cone growth is increased to at least 120% of the average power supplied to the heater during the growth of the second half of the main body. Most preferably, the average power during end-cone growth is increased to at least 130% of the average power supplied to the heater during the growth of the second half of the main body. The average power needed in the process will depend, in part, upon the diameter of the crystal. As the diameter of the crystal increases, the average power required also increases.

As illustrated in the following Examples, the process of the present invention may be used to more precisely regulate the thermal history of single silicon crystals. The more precisely the pull rate is maintained at a constant value, the more uniform the thermal history of the crystal will be. The Examples below set forth several sets of conditions that may be used to achieve the desired result. Depending upon such parameters as single crystal nominal diameter, crucible diameter and charge size, it may be desirable to further adjust the rates of rotation of the crystal and the crucible as well as the power supplied to the heater at some point during the growth of the end-cone. Data similar to FIGS. 5(a), 5(b), 6(a) and 6(b) can be generated for other crystal diameters, axial lengths, crucible rotation rates, crystal rotation rates, crystal pull rates and heater powers. A crucible rotation rate and crystal rotation rate ramping program to produce a desired thermal history for the crystal can then be deduced. Such embodiments are contemplated within the scope of the present invention so long as the rates of rotation are decreased and the power is increased from their values at the initiation of the growth of the end-cone.

The following examples illustrate the invention:

EXAMPLE 1

A single silicon crystal (200 mm nominal diameter and 600 mm nominal length) was pulled from an 18 inch diameter crucible containing a 60 kg polysilicon charge using a Leybold crystal puller. The crystal pull rate during the growth of the second half of the main body of the crystal was maintained between about 0.50 mm/minute to about 0.75 mm/minute. The rates of rotation of the crystal and the crucible were maintained at between about 10 rpm to about 15 rpm, and between about 5 rpm to about 10 rpm, respectively, during the growth of the main body. The power supplied to the heater was maintained between about 90 kW to 100 kW during the growth of the main body.

During the growth of the end-cone, the crystal pull rate remained between about 0.50 mm/minute and about 0.75 mm/minute, and the power supplied to the heater was gradually increased relative to the average power supplied during the growth of the second half of the main body. The power was increased in an approximately linear manner with the total overall increase being about 10.5 kW. In addition, the rates of rotation of the crystal and the crucible were gradually decreased from about 10 rpm to about 5 rpm, and from about 6 rpm to about 1 rpm, respectively. An end-cone was successfully grown and separated from the silicon melt. FIGS. 5(a) and 5(b) summarize the specific values of the crystal pull rate, crystal rotation rate, crucible rotation rate and heater power throughout the growth of the end-cone.

EXAMPLE 2

A single silicon crystal (200 mm nominal diameter and 600 mm nominal length) was pulled from an 18 inch diameter crucible containing a 60 kg polysilicon charge using a Leybold crystal puller. The crystal pull rate during the growth of the second half of the main body of the crystal was between about 0.50 mm/minute to about 0.75 mm/minute. The rates of rotation of the crystal and the crucible were between about 10 rpm to about 15 rpm, and between about 5 rpm to about 10 rpm during the growth of the main body. The power supplied to the heater was maintained between about 90 kW to 100 kW during the growth of the main body.

During the growth of the end-cone, the crystal pull rate remained between about 0.50 mm/minute to about 0.75 mm/minute, and the rates of rotation of the crystal and the crucible were maintained at about 10 rpm and about 6 rpm, respectively. The power supplied to the heater was gradually increased relative to the average power supplied during the growth of the second half of the main body. The power was increased in an approximately linear manner with the total overall increase being about 20 kW. An end-cone was successfully grown and separated from the silicon melt. FIGS. 6(a) and 6(b) summarize the specific values of the crystal pull rate, crystal rotation rate, crucible rotation rate and heater power throughout the growth of the end-cone.

EXAMPLE 3

Figure 7:
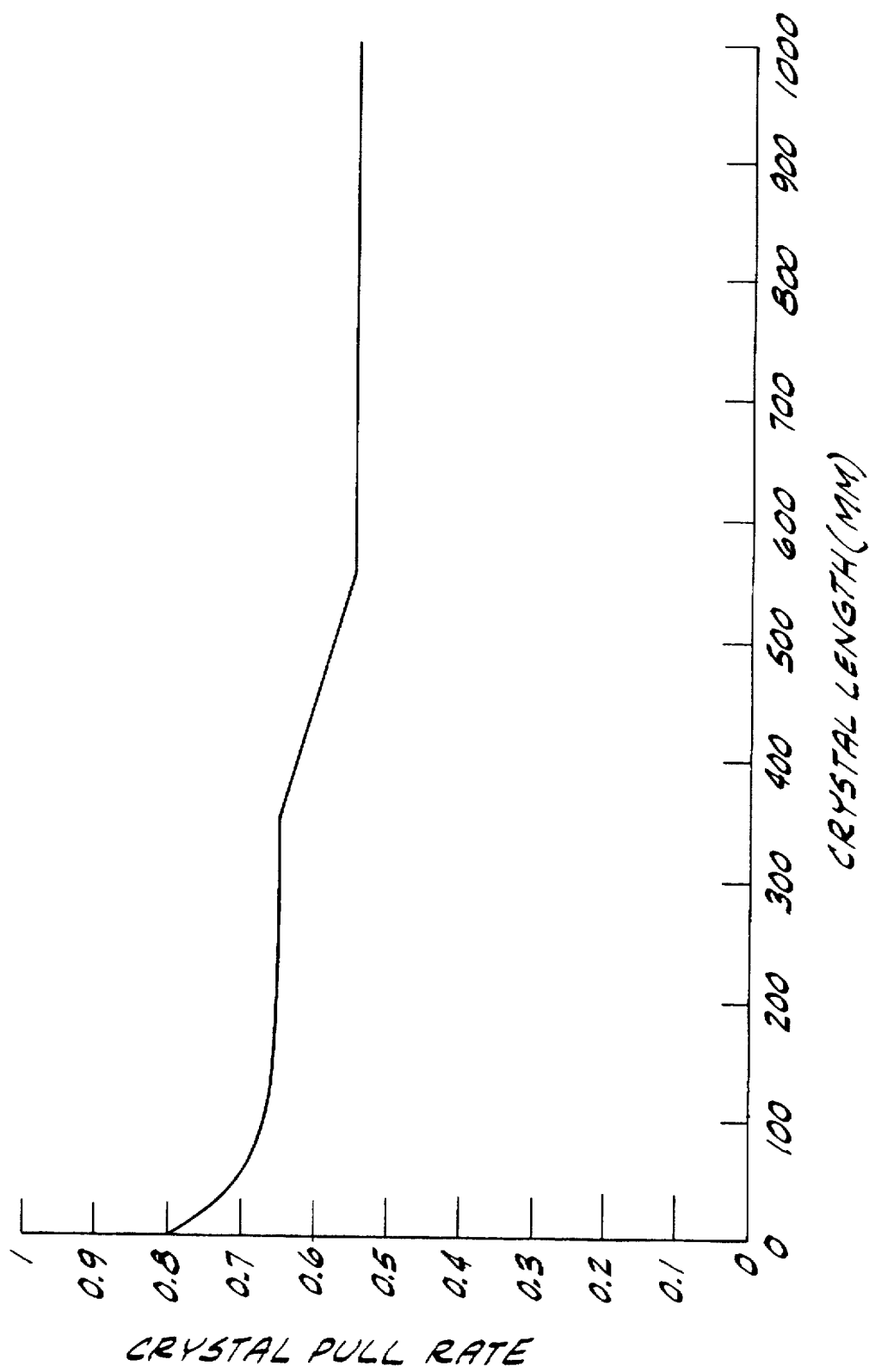
FIG. 7 is a graph showing a linear model of the crystal pull rate during of the growth of a 200 mm nominal diameter crystal in accordance with the new process.
Figure 8:
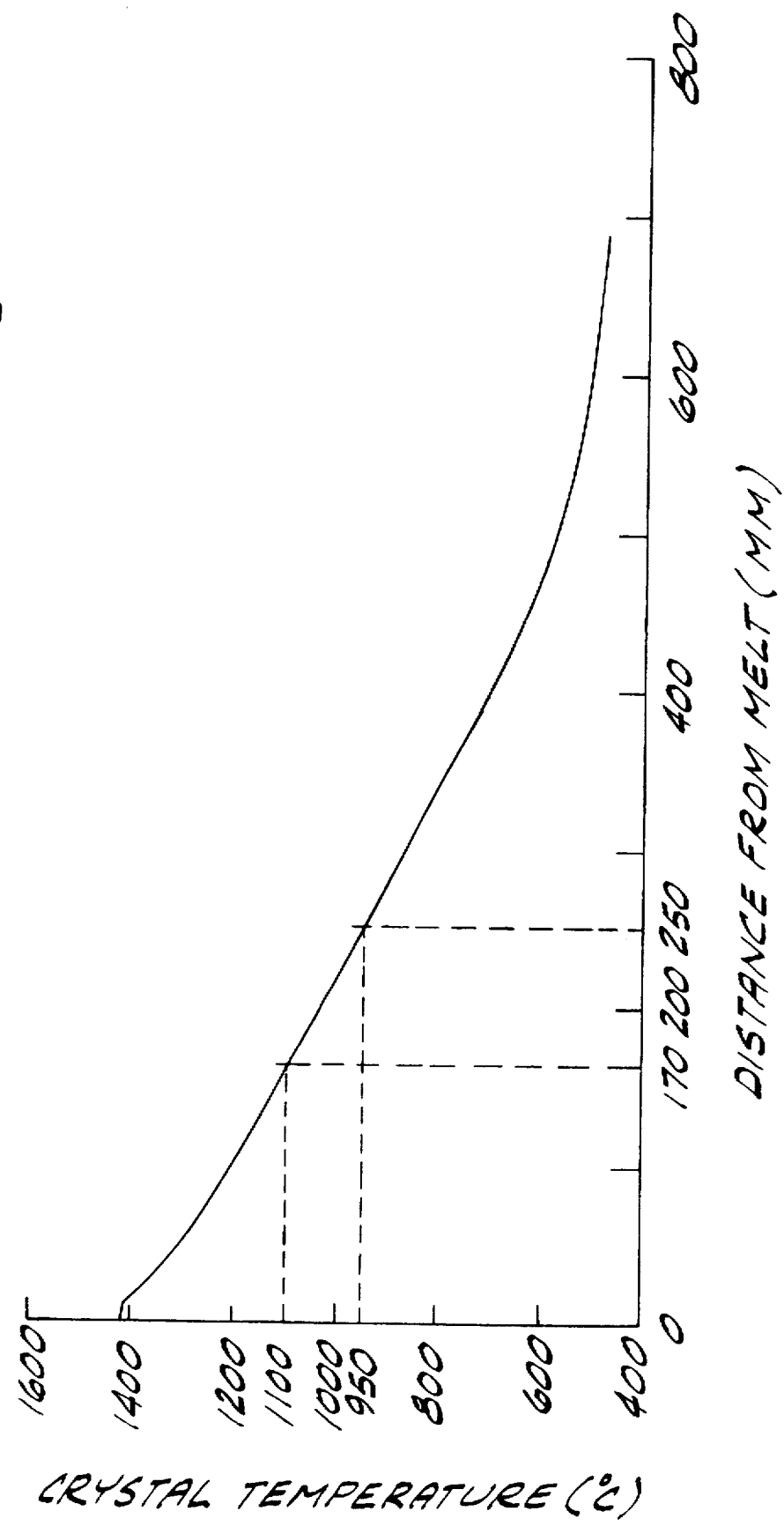
FIG. 8 is a graph showing the axial temperature profile of a crystal pulled in accordance with the new process while in contact with the silicon melt.

A single silicon crystal (200 mm nominal diameter and 700 mm nominal length) was pulled from a 22 inch diameter crucible containing a 100 kg polysilicon charge using a Ferrofluidics crystal puller. The crystal pull rate during the growth of the crystal is reflected in FIG. 7. During the growth of the 250 mm to 700 mm portion of the crystal, the pull rate averaged about 0.65 mm/minute. The rates of rotation of the crystal and the crucible during the growth of this portion of the crystal were between about 11 rpm to about 14 rpm, and between about 6 rpm to about 9 rpm, respectively. The power supplied to the heater during the growth of this portion of the crystal was maintained between about 140 kW to about 200 kW. The axial temperature profile of the crystal while in contact with the silicon melt is reflected in FIG. 8.

End-cone growth started when the crystal length was about 700 mm. The crystal pull rate was maintained at about 0.58 mm/minute throughout the growth of the end-cone. During the growth of the end-cone, the rates of rotation of the crystal and the crucible were maintained at about 12 rpm and about 8 rpm, respectively. The power supplied to the heater was gradually increased relative to the average power supplied during the growth of the second half of the main body. The power was increased in an approximately linear manner with the total overall increase being about 20 kW.

Figure 9A:
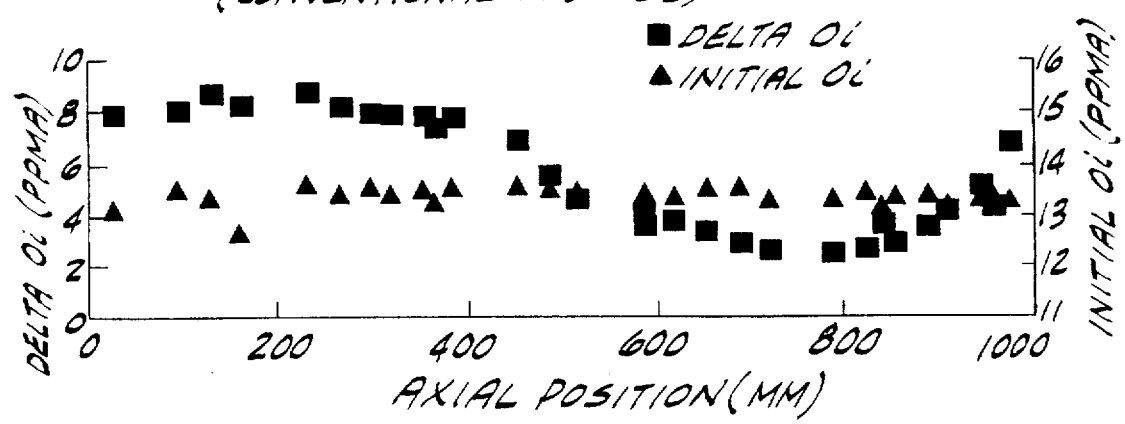
FIG. 9(a) is a graph showing the amount of precipitated oxygen and the axial variation thereof throughout the crystal for a crystal grown in the conventional manner.
Figure 9B:
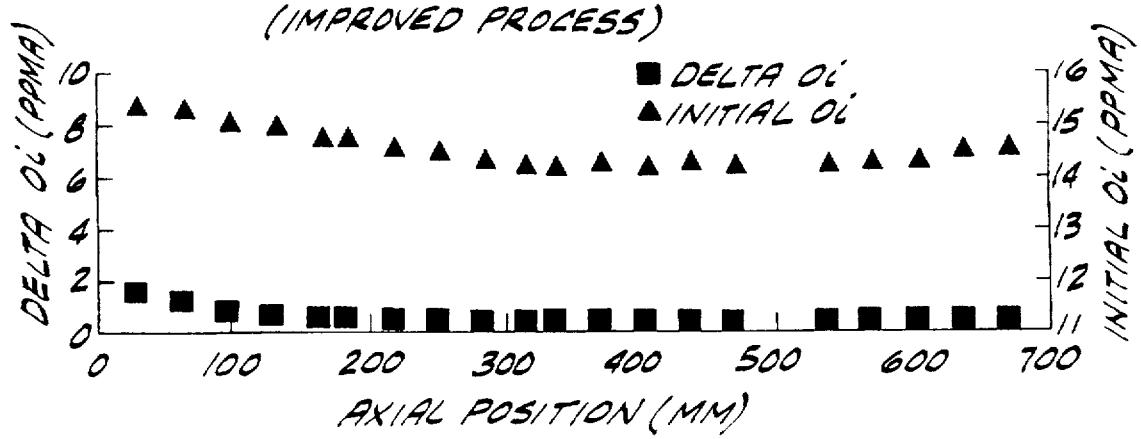
FIG. 9(b) is a graph showing the amount of precipitated oxygen and the axial variation thereof throughout the crystal for a crystal grown in accordance with the new process.
Figure 10A:
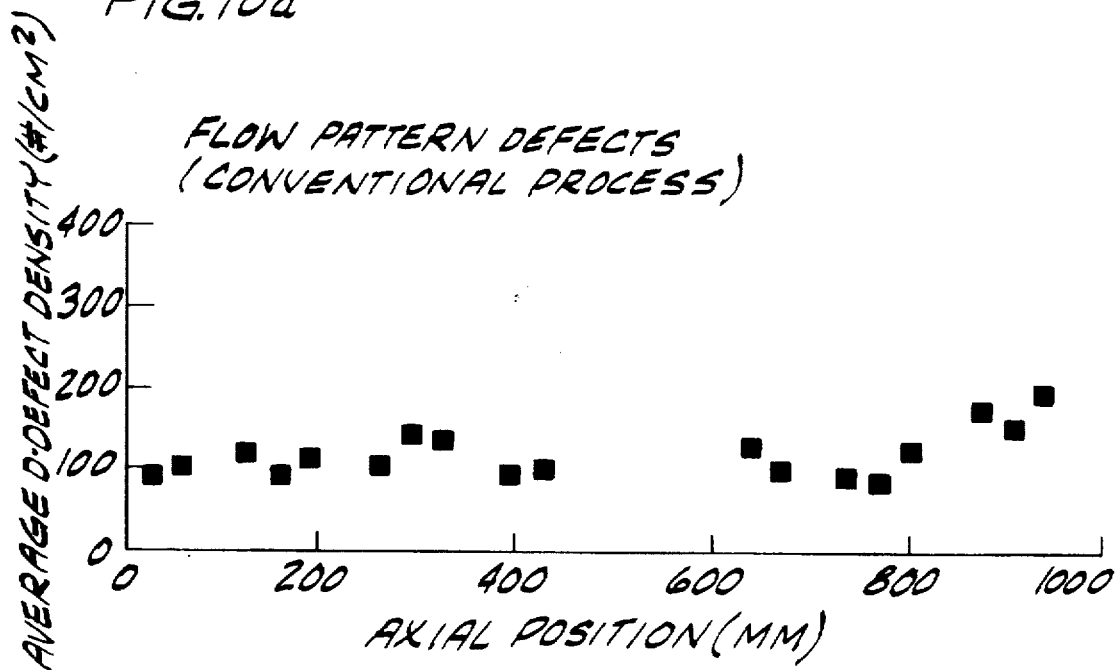
FIG. 10(a) is a graph showing the density of flow pattern defects and the axial variation in density throughout the crystal for a crystal grown in the conventional manner.
Figure 10B:
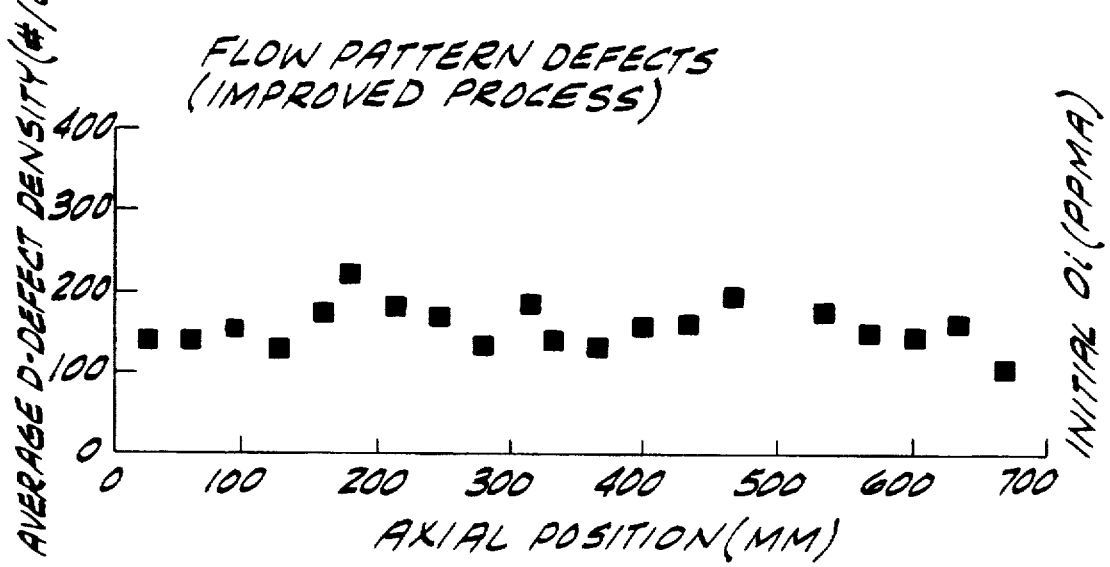
FIG. 10(b) is a graph showing the density of flow pattern defects and the axial variation in density throughout the crystal for a crystal grown in accordance with the new process.

A longitudinal section of the main body of the crystal was then annealed using a precipitation cycle consisting of 4 hours at a temperature of 800° C. followed by 16 hours at a temperature in excess of 1000° C. This longitudinal section was examined by FTIR Spectroscopy to determine the amount of oxygen precipitated and by a 30 minute Secco etch to determine the flow pattern defect density throughout the crystal. FIG. 9(b) is a graph showing the amount of oxygen precipitated and the axial variation thereof throughout the crystal. FIG. 10(b) is a graph showing the density of flow pattern defects and the axial variation in density throughout the crystal.

Comparative Example 1

Figure 11:
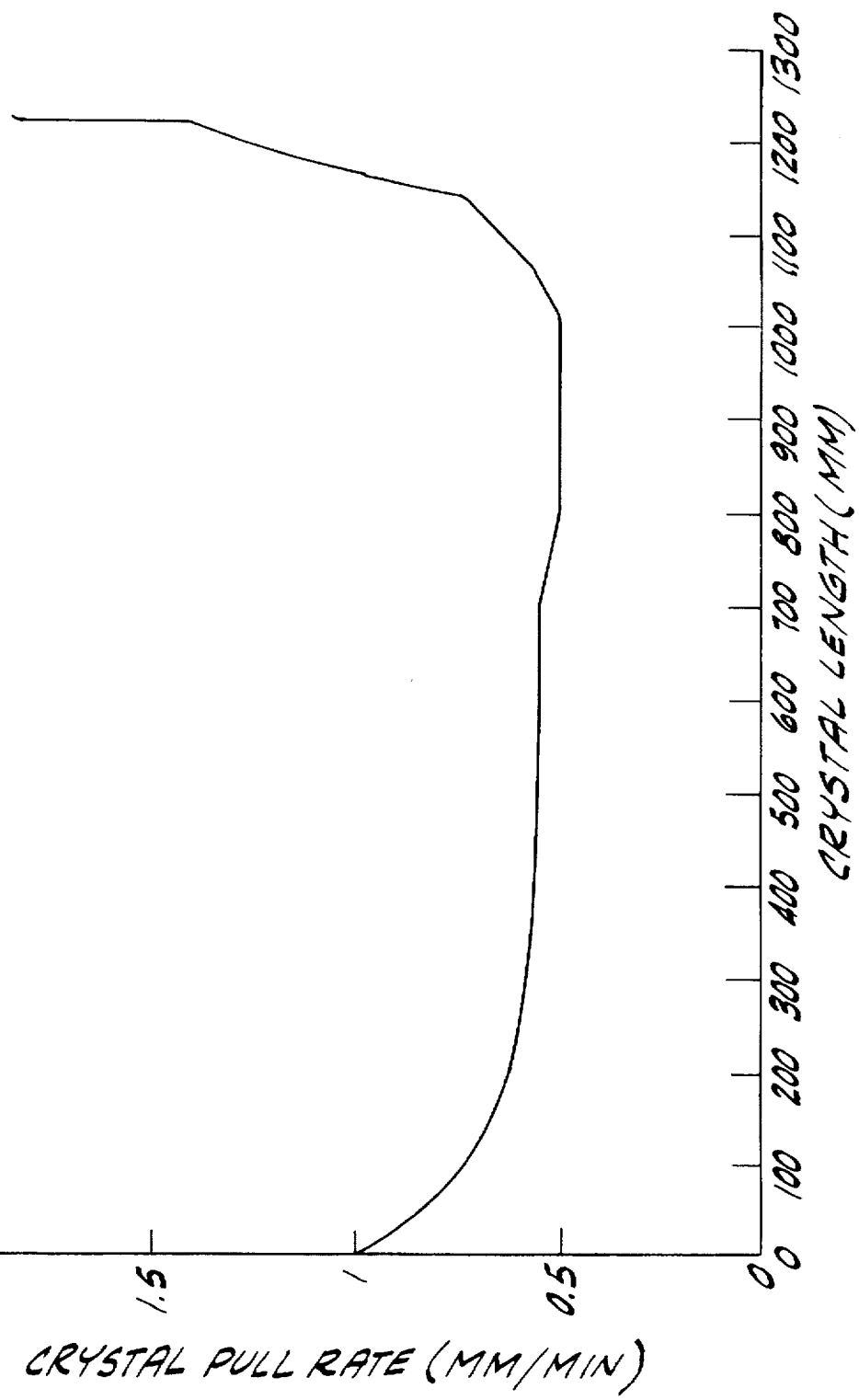
FIG. 11 is a graph showing a linear model of the crystal pull rate during of the growth of a 200 mm nominal diameter crystal in the conventional manner.

A single silicon crystal (200 mm nominal diameter and 1000 mm nominal length) was pulled from a 22 inch diameter crucible containing a 100 kg polysilicon charge using a Ferrofluidics crystal puller in the conventional manner. The crystal pull rate during the growth of the crystal is reflected in FIG. 11. During the growth of the 250 mm to 900 mm portion of the crystal, the pull rate averaged about 0.55 mm/minute. The rates of rotation of the crystal and the crucible during the growth of this portion of the crystal were between about 12 rpm to about 15 rpm, and between about 6 rpm to about 9 rpm, respectively. The power supplied to the heater during the growth of this portion of the crystal was maintained between about 150 kW to about 200 kW. The axial temperature profile of the crystal while in contact with the silicon melt is reflected in FIG. 8.

The axial positions of this crystal corresponding to temperatures of about 1100° C. and about 950° C. were about 170 mm and about 250 mm above the melt surface, respectively. Therefore, the growth region for flow pattern defects in this crystal had an axial length of about 80 mm. Based on an average pull rate of about 0.55 mm/minute, the 250 mm to 750 mm portion of the crystal had a residence time of about 145 minutes in the temperature range from about 950° C. to about 1100° C., and an average cooling rate in this temperature range of about 1.03° C./minute.

Growth of a 300 mm end-cone started when the crystal length was about 1000 mm. At this time the axial positions of the crystal corresponding to temperatures of about 1100° C. and about 950° C. were at about the 830 mm position (about 170 mm above the melt surface) and the 750 mm position (about 250 mm above the melt surface), respectively. The crystal pull rate was steadily increased until it reached a rate of about 0.6 mm/minute at about the 1075 mm position of the crystal. At this time the axial positions of the crystal corresponding to temperatures of about 1100° C. and about 950° C. were at about the 905 mm position (about 170 mm above the melt surface) and the 825 mm position (about 250 mm above the melt surface), respectively. The crystal pull rate was then steadily increased until it reached a rate of about 0.8 mm/minute at the 1150 position of the crystal. At this time the axial positions of the crystal corresponding to temperatures of about 1100° C. and about 950° C. were at about the 980 mm position (about 170 mm above the melt surface) and the 900 mm position (about 250 mm above the melt surface), respectively.

Based on an average pull rate of about 0.70 mm/minute, therefore, the segment of the crystal at about 900 mm had a residence time of about 115 minutes in the temperature range from about 950° C. to about 1100° C., and an average cooling rate in this temperature range of about 1.30° C./minute. Overall, the residence time for the 750 mm to 900 mm portion of this crystal was about 20% lower than the residence time for the tail end portion of the crystal grown in Example 3. Residence time for the remaining 100 mm length of the main body of the crystal was even lower due to the continuing increase in the pull rate as this portion of the crystal cooled to 950° C.

During the growth of the end-cone, the rates of rotation of the crystal and the crucible were maintained at between about 8 rpm and about 12 rpm, and between about 4 rpm and about 10 rpm, respectively. The power supplied to the heater was gradually increased relative to the average power supplied during the growth of the second half of the main body. The power was increased in an approximately linear manner with the total overall increase being about 20 kW.

A longitudinal section of the main body of the crystal was then annealed using an oxygen precipitation cycle consisting of 4 hours at a temperature of 750° C., followed by 4 hours at 900° C., followed by 16 hours at a temperature in excess of 1000° C. This longitudinal section was examined by FTIR Spectroscopy to determine the amount of precipitated oxygen concentration and by a 30 minute Secco etch to determine flow pattern defect density throughout the crystal. FIG. 9(a) is a graph showing the amount of precipitated oxygen and the axial variation thereof throughout the crystal. FIG. 10(a) is a graph showing the density of flow pattern defects and the axial variation in density throughout the crystal. As the figures reflect, greater axial uniformity of the amount of oxygen precipitated and the flow pattern defect density is obtained in crystal grown according to the present invention (Example 3) than in crystal grown according to the conventional manner (Comparative Example 1). The improved axial uniformity is particularly pronounced at the end of the main body of the crystal. Instead of the exhibiting the increase in the amount of oxygen precipitated and the flow pattern defect density typically observed at the end of the main body in conventional crystal, crystal grown according to the present invention exhibits relatively consistent values for these crystal defects.

Although specific examples of the present invention and its application are set forth, it is not intended that they be exhaustive or limiting of the invention. These illustrations and explanations are intended to acquaint others skilled in the art with the invention, its principles, and its practical application, so that others skilled in the art may adapt and apply the invention in its numerous forms, as may be best suited to the requirements of a particular use.

We claim:

1. A process for controlling the thermal history of a single crystal silicon ingot during a crystal growth process in which the silicon ingot is rotated and pulled from a silicon melt contained within a rotating crucible in accordance with the Czochralski technique, the ingot having, in succession, a cone, a main body having a first half and a second half, and an end-cone, the process comprising:

pulling the second half of the main body of the ingot from the silicon melt at a rate $R_B$, wherein $R_B$ is the average growth rate for the second half of the main body of the crystal as a function of time;

pulling the end-cone of the ingot from the silicon melt at a rate $R_E$, wherein $R_E$ is the average growth rate for the end-cone of the ingot as a function of time; and controlling $R_B$ and $R_E$ such that the ratio of $R_E$ to $R_B$ is between about 0.50 and about 1.50.

2. The process of claim 1 wherein the ratio of $R_E$ to $R_B$ is between about 0.65 to about 1.35.

3. The process of claim 1 wherein the ratio of $R_E$ to $R_B$ is between about 0.80 to about 1.20.

4. The process of claim 1 wherein the ratio of $R_E$ to $R_B$ is between about 0.90 to about 1.10.

5. The process of claim 1 wherein the ratio of $R_E$ to $R_B$ is between about 0.95 to about 1.05.

6. The process of claim 1 wherein the average growth rate for the end-cone as a function of time is about 0.45 mm/minute to about 1.25 mm/minute.

7. The process of claim 1 wherein the average growth rate for the end-cone as a function of time is about 0.45 mm/minute to about 0.65 mm/minute.

8. The process of claim 1 wherein the average growth rate for the end-cone as a function of time is about 0.45 mm/minute to about 0.55 mm/minute.

9. The process of claim 1 wherein the average rates of rotation of the crucible and ingot during the growth of the end-cone are less than the average rates of rotation of the crucible and ingot during the growth of the main body, respectively.

10. The process of claim 9 wherein the rate of rotation of the ingot during the growth of the end-cone is less than about 12 revolutions per minute.

11. The process of claim 9 wherein the rate of rotation of the crucible during the growth of the end-cone is less than about 8 revolutions per minute.

12. The process of claim 9 wherein during the growth of the end-cone the rate of rotation of the ingot is less than about 12 revolutions per minute, and the rate of rotation of the crucible is less than about 8 revolutions per minute.

13. The process of claim 9 wherein the rates of rotation for the ingot and the crucible are gradually decreased during the growth of the end-cone.

14. The process of claim 1 wherein the crucible is heated by a heater during the growth of the ingot and the average power supplied to the heater during the growth of the end-cone is greater than the average power supplied to the heater during the growth of the second half of the main body.

15. The process of claim 14 wherein the average power supplied to the heater during the growth of the end-cone is at least about 110% of the average power supplied to the heater during the growth of the second half of the main body.

16. The process of claim 14 wherein the average power supplied to the heater during the growth of the end-cone is at least about 120% of the average power supplied to the heater during the growth of the second half of the main body.

17. The process of claim 14 wherein the average power supplied to the heater during the growth of the end-cone is at least about 130% of the average power supplied to the heater during the growth of the second half of the main body.

18. A process for controlling the thermal history of a single crystal silicon ingot during a crystal growth process in which the silicon ingot is rotated and pulled from a silicon melt contained within a rotating crucible in accordance with the Czochralski technique, the ingot having, in succession, a cone, a main body having a first half and a second half, said second half further divided into a first portion and a second portion, and an end-cone, the process comprising:

controlling the growth of the ingot so as to provide a residence time $T_F$ for each axial segment of the first portion of the second half of the main body, wherein $T_F$ is the time the segment remains at a temperature between about 950° C. and about 1100° C. after being drawn from the silicon melt;

controlling the growth of the ingot so as to provide a residence time of $T_S$ for each axial segment of the second portion of the second half of the main body, wherein $T_S$ is the time the segment remains at a temperature between about 950° C. and about 1100° C. after being drawn from the silicon melt;

controlling $T_F$ and $T_S$ such that the ratio of $T_F$ to $T_S$ is between about 0.50 and about 1.50.

19. The process of claim 18 wherein the ratio of $T_F$ to $T_S$ is between about 0.65 to about 1.35.

20. The process of claim 18 wherein the ratio of $T_F$ to $T_S$ is between about 0.80 to about 1.20.

21. The process of claim 18 wherein the ratio of $T_F$ to $T_S$ is between about 0.90 to about 1.10.

22. The process of claim 18 wherein the ratio of $T_F$ to $T_S$ is between about 0.95 to about 1.05.

23. The process of claim 18 wherein $T_F$ and $T_S$ are each greater than about 115 minutes.

24. The process of claim 18 wherein $T_F$ and $T_S$ are each greater than about 125 minutes.

25. The process of claim 18 wherein $T_F$ and $T_S$ are each greater than about 135 minutes.

26. The process of claim 18 wherein the average rates of rotation of the crucible and ingot during the growth of the end-cone are less than the average rates of rotation of the crucible and ingot during the growth of the main body, respectively.

27. The process of claim 26 wherein the rate of rotation of the ingot during the growth of the end-cone is less than about 12 revolutions per minute.

28. The process of claim 26 wherein the rate of rotation of the crucible during the growth of the end-cone is less than about 8 revolutions per minute.

29. The process of claim 26 wherein during the growth of the end-cone the rate of rotation of the ingot is less than about 12 revolutions per minute, and the rate of rotation of the crucible is less than about 8 revolutions per minute.

30. The process of claim 26 wherein the rates of rotation for the ingot and the crucible are gradually decreased during the growth of the end-cone.

31. The process of claim 18 wherein the crucible is heated by a heater during the growth of the ingot and the average power supplied to the heater during the growth of the end-cone is greater than the average power supplied to the heater during the growth of the second half of the main body.

32. The process of claim 31 wherein the average power supplied to the heater during the growth of the end-cone is at least about 110% of the average power supplied to the heater during the growth of the second half of the main body.

33. The process of claim 31 wherein the average power supplied to the heater during the growth of the end-cone is at least about 120% of the average power supplied to the heater during the growth of the second half of the main body.

34. The process of claim 31 wherein the average power supplied to the heater during the growth of the end-cone is at least about 130% of the average power supplied to the heater during the growth of the second half of the main body.

35. A process for controlling the thermal history of a single crystal silicon ingot during a crystal growth process in which the silicon ingot is rotated and pulled from a silicon melt contained within a rotating crucible in accordance with the Czochralski technique, the ingot having, in succession, a cone, a main body having a first half and a second half, said second half further divided into a first portion and a second portion, and an end-cone, the process comprising:

cooling each axial segment of the first portion of the second half of the main body from about 1100° C. to about 950° C. at a rate of $C_F$, wherein $C_F$ is the average rate of cooling as a function of time;

cooling each axial segment of the second portion of the second half of the main body from about 1100° C. to about 950° C. at a rate of $C_S$, wherein $C_S$ is the average rate of cooling as a function of time;

controlling $C_F$ and $C_S$ such that the ratio of $C_F$ to $C_S$ is between about 0.50 to about 1.50.

36. The process of claim 35 wherein the ratio of $C_F$ to $C_S$ is between about 0.65 to about 1.35.

37. The process of claim 35 wherein the ratio of $C_F$ to $C_S$ is between about 0.80 to about 1.20.

38. The process of claim 35 wherein the ratio of $C_F$ to $C_S$ is between about 0.90 to about 1.10.

39. The process of claim 35 wherein the ratio of $C_F$ to $C_S$ is between about 0.95 to about 1.05.

40. The process of claim 35 wherein $C_F$ and $C_S$ are each less than about 1.5° C./minute.

41. The process of claim 35 wherein $C_F$ and $C_S$ are each less than about 1.3° C./minute.

42. The process of claim 35 wherein $C_F$ and $C_S$ are each less than about 1.1° C./minute.

43. The process of claim 35 wherein the average rates of rotation of the crucible and ingot during the growth of the end-cone are less than the average rates of rotation of the crucible and ingot during the growth of the main body, respectively.

44. The process of claim 43 wherein the rate of rotation of the ingot during the growth of the end-cone is less than about 12 revolutions per minute.

45. The process of claim 43 wherein the rate of rotation of the crucible during the growth of the end-cone is less than about 8 revolutions per minute.

46. The process of claim 43 wherein during the growth of the end-cone the rate of rotation of the ingot is less than about 12 revolutions per minute, and the rate of rotation of the crucible is less than about 8 revolutions per minute.

47. The process of claim 43 wherein the rates of rotation for the ingot and the crucible are gradually decreased during the growth of the end-cone.

48. The process of claim 35 wherein the crucible is heated by a heater during the growth of the ingot and the average power supplied to the heater during the growth of the end-cone is greater than the average power supplied to the heater during the growth of the second half of the main body.

49. The process of claim 48 wherein the average power supplied to the heater during the growth of the end-cone is at least about 110% of the average power supplied to the heater during the growth of the second half of the main body.

50. The process of claim 48 wherein the average power supplied to the heater during the growth of the end-cone is at least about 120% of the average power supplied to the heater during the growth of the second half of the main body.

51. The process of claim 48 wherein the average power supplied to the heater during the growth of the end-cone is at least about 130% of the average power supplied to the heater during the growth of the second half of the main body.

* * * * *

UNITED STATES PATENT AND TRADEMARK OFFICE
CERTIFICATE OF CORRECTION

PATENT NO.  : 5,779,791
DATED       : July 14, 1998
INVENTOR(S) : Harold W. Korb et al.

It is certified that error appears in the above-identified patent and that said Letters Patent is hereby corrected as shown below:

On the title page,
  "[75] Inventors: Harold W. Korb,
Town & Country; Sadasivam
Chandrasekhar, Chesterfield, both of
Mo.; Robert J. Falster, Milan, Italy;
Joseph C. Holzer, Manchester, Mo.;
Hyong-Min Kim, St. Charles, Mo.;
Steven L. Kimbel, St. Charles, Mo.;
Larry E. Drafall, St. Charles, Mo."
should read
  -- [75] Inventors: Harold W. Korb,
Town & Country; Sadasivam
Chandrasekhar, Chesterfield, both of
Mo.; Robert J. Falster, Milan, Italy;
Joseph C. Holzer, Manchester, Mo.;
Srdjan Ilic, Bolzano, Italy;
Hyong-Min Kim, St. Charles, Mo.;
Steven L. Kimbel, St. Charles, Mo.;
Larry E. Drafall, St. Charles,
Mo. --.

Signed and Sealed this

Fifteenth Day of December, 1998

Attest:

BRUCE LEHMAN

*Attesting Officer*    *Commissioner of Patents and Trademarks*